(12) United States Patent
Simakov et al.

(10) Patent No.: US 11,899,358 B2
(45) Date of Patent: Feb. 13, 2024

(54) METHOD FOR MEASURING PHOTOMASKS

(71) Applicant: Carl Zeiss SMT GmbH, Oberkochen (DE)

(72) Inventors: Dmitry Simakov, Jena (DE); Thomas Thaler, Jena (DE); Steffen Steinert, Jena (DE); Dirk Beyer, Weimar (DE); Ute Buttgereit, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 12 days.

(21) Appl. No.: 17/177,411

(22) Filed: Feb. 17, 2021

(65) Prior Publication Data

US 2021/0255541 A1   Aug. 19, 2021

(30) Foreign Application Priority Data

Feb. 18, 2020   (DE) .......................... 102020104167.5

(51) Int. Cl.
  *G03F 1/72* (2012.01)
  *G03F 1/84* (2012.01)

(52) U.S. Cl.
  CPC . *G03F 1/72* (2013.01); *G03F 1/84* (2013.01)

(58) Field of Classification Search
  CPC ..................................... G03F 1/72; G03F 1/84
  See application file for complete search history.

(56) References Cited

U.S. PATENT DOCUMENTS

| | | | |
|---|---|---|---|
| 5,504,793 A * | 4/1996 | Chen | G03F 7/70783 378/34 |
| 10,176,966 B1 | 1/2019 | Mack | |
| 2008/0288912 A1 * | 11/2008 | Kim | G03F 1/84 716/50 |
| 2009/0217224 A1 | 8/2009 | Wiaux et al. | |
| 2009/0298205 A1 | 12/2009 | Nagahara | |
| 2010/0028788 A1 | 2/2010 | Saito | |
| 2011/0016437 A1 | 1/2011 | Scherübl et al. | |
| 2011/0155904 A1 | 6/2011 | Hotta et al. | |

(Continued)

FOREIGN PATENT DOCUMENTS

| | | |
|---|---|---|
| DE | 102018111972 | 5/2019 |
| JP | 2009-200499 A | 9/2009 |

(Continued)

OTHER PUBLICATIONS

English machine translation of JP-2017058397-A (Mar. 2017) (Year: 2017).*
The German Office Action for German Application No. DE 10 2020 104 167.5, dated Oct. 20, 2020 (English Translation).

(Continued)

*Primary Examiner* — Peter L Vajda
*Assistant Examiner* — Jayson D Cosgrove
(74) *Attorney, Agent, or Firm* — Fish & Richardson P.C.

(57) ABSTRACT

The invention relates to a method for measuring a photomask for semiconductor lithography, including the following steps:
  recording an aerial image of at least one region of the photomask,
  defining at least one region of interest,
  ascertaining structure edges in at least one region of interest,
  providing desired structures to be produced by the photomask,
  adapting the ascertained structure edges to the desired structures, and
  displacing the adapted structure edges by means of the results of a separate registration measurement.

20 Claims, 4 Drawing Sheets

(56) References Cited

U.S. PATENT DOCUMENTS

| | | |
|---|---|---|
| 2012/0053892 A1 | 3/2012 | Matsuoka et al. |
| 2013/0295698 A1 | 11/2013 | Pforr et al. |
| 2014/0037187 A1 | 2/2014 | Marcuccilli et al. |
| 2018/0267399 A1 | 9/2018 | Quaglio et al. |

FOREIGN PATENT DOCUMENTS

| | | | |
|---|---|---|---|
| JP | 2009-294308 A | | 12/2009 |
| JP | 2010-38944 A | | 2/2010 |
| JP | 2010-199462 A | | 9/2010 |
| JP | 2014-82516 A | | 5/2014 |
| JP | 2015-527740 A | | 9/2015 |
| JP | 2017058397 A | * | 3/2017 |
| KR | 1020170137695 | | 12/2017 |
| TW | 201327030 | | 7/2013 |
| WO | WO 2012/013638 | | 2/2012 |

OTHER PUBLICATIONS

The Office Action and Search Report issued by the Taiwan Patent Office for Application No. TW 110105486 dated Nov. 25, 2021 (English Translation).

The Notice of Reasons for Refusal issued by the Japanese Patent Office for Application No. JP 2021-024113, dated Jun. 7, 2022 (with English Translation).

The Second Office Action and Search Report issued by the Taiwan Patent Office for Application No. TW 110105486, dated Jun. 30, 2022 (with English Translation).

The Decision of Final Rejection issued by the Japanese Patent Office for Application No. JP 2021-024113, dated Feb. 7, 2023 (with English Translation).

The Notice of Reasons for Rejection issued by the Korean Patent Office for Application No. KR 10-2021-0021797, dated Apr. 10, 2023 (English Translation).

* cited by examiner

METHOD FOR MEASURING PHOTOMASKS

CROSS-REFERENCE TO RELATED APPLICATIONS

This application claims priority from German Application No. DE 10 2020 104 167.5, filed on Feb. 18, 2020, the contents of which is incorporated by reference in its entirety.

TECHNICAL FIELD

The invention relates to a method for measuring photomasks for semiconductor lithography, in particular for ascertaining so-called registration errors. In this context, registration should be understood to mean the position of structures on the mask (and subsequently also on the wafer) relative to position markers, so-called alignment markers, on the photomask. In a projection exposure apparatus, the alignment markers on the mask in particular also serve to set the mask position relative to the imaging optical unit of the apparatus (and hence the location of the imaging on the wafer).

BACKGROUND

Hence, a registration error is the deviation of the real position of a structure on a mask relative to the intended position in relation to the respectively associated alignment marker and hence in relation to the mask coordinate system. Such errors add up, particularly in the cases where a so-called double exposure is carried out for the purposes of forming complex structures on the wafer, i.e., where one layer on the wafer is successively exposed by use of two different photomasks, and so a correct registration or at least accurate knowledge of the registration errors is particularly important in this case.

Different systems, for example coordinate measuring machines, are currently available for the determination of the registration of photomasks. Such systems offer an excellent spatial resolution down to the sub-nanometer range. To determine the registration, use is typically made of recorded aerial images of certain structures to be exposed, so-called features, or else of edges of structures. However, the specified systems use an illumination and an optical unit that deviate significantly from the subsequent conditions in a projection exposure apparatus. This leads to a contour created on a real wafer deviating significantly from the contour for the determination of the registration in the coordinate measuring machine, both in respect of its relative position and in respect of its form. As a result, the correlation between the registration measured on the mask plane and the actual registration generated on a wafer is not yet optimal.

A more realistic representation of the light intensities generated on a wafer is possible by way of systems for producing aerial images of masks. The aforementioned systems are distinguished in that they emulate the illumination and imaging conditions of a real projection exposure apparatus comparatively well and hence facilitate a prediction of the image generated on the wafer, in particular also of contours and edges, which comes close to reality. However, these systems offer no options for the highly precise measurement of a registration. Furthermore, the correction of distortions in the recorded image is limited; the errors as a result of the distortions are similar to conventional registration errors and cannot be distinguished from registration errors in the imaging plane.

SUMMARY

It is an aspect of the present invention to specify a method which permits a more accurate prediction of registration errors on the wafer plane in a semiconductor lithography process without requiring an exposure of a wafer to this end.

This aspect is achieved by a method having the features of independent claim 1. The dependent claims relate to advantageous developments and variants of the invention.

The method according to the invention for measuring a photomask for semiconductor lithography comprises the following steps:
- recording an aerial image of at least one region of the photomask,
- defining at least one region of interest (ROI), i.e., a region in the aerial image containing structures of interest,
- ascertaining the structure edges, i.e., the boundaries of the structures of interest, in at least one region of interest,
- providing desired structures to be produced by the photomask,
- adapting the ascertained structure edges to the desired structures; these structures may also be referred to as "litho-targets," and
- displacing the adapted structure edges by use of the results of a separate registration measurement.

On account of optical effects and mask design rules, the aforementioned litho-targets deviate slightly in terms of their contours from the contours of the corresponding structures on the aerial image. A small positioning error of the measured structures arises on account of this deviation. Hence, the ascertained structures from the aerial image are at their correct positions—apart from the aforementioned small error.

As a result, a data record or information items containing more precise information items about the errors to be expected, in particular registration errors of the mask, is/are obtained in this way. Consequently, the result can contain, in particular, a realistic aerial image of the mask with largely correct registration information.

To improve the quality of the alignment and adaptation process, a computational correction of image errors, aberrations and imaging aberrations of the system used to produce the aerial image can be implemented after the production of the aerial image.

In one variant of the invention, an improvement of the measurement result can be achieved by virtue of using an aerial image simulated on the basis of the mask design in the step of adapting the ascertained structure edges.

For the simulated aerial images, it is possible to assume that the structures simulated therewith are at their correct positions—albeit with slight deviations from realistic aerial images. However, the deviations are small since optical effects and design rules have already been taken into account in the simulation. Furthermore, the alignment on the basis of an overall profile of intensity levels is more precise than the alignment on the basis of contours. For these two reasons there is an improved alignment of the structures from the aerial image measurements.

Here, the simulated aerial image can be generated for a registration measurement system and/or for a mask inspection system. Expressed differently, the simulated aerial image is generated by virtue of the imaging properties of a registration measurement system and/or of a mask inspection system forming the basis for the respective simulation.

Correction strategies can be developed on the basis of the result in a further step in order to correct the measured error.

Here, it is possible to correct either the effects of the measured errors on the image in the wafer or the errors in the mask itself.

In a first variant, the errors ascertained can be corrected by way of the scanner-inherent correction options. To this end, the ascertained offset of structures, for example, serves as an input parameter for the scanner software which subsequently creates a strategy with which, under dynamic adaptation of suitable scanner parameters, the distortion when exposing the wafer in the scanner is corrected in situ.

In a further case, use can be made of an apparatus for physical mask distortion, for example the RegC or ForTune systems from Carl Zeiss SMT GmbH. Such apparatuses are able to stretch the mask physically at points. When the aforementioned result is entered, the apparatus-dedicated software can develop a suitable mask treatment.

Ideally, the options from the scanner and the mask distortion apparatus are considered in combination in order to obtain the best possible correction result.

Moreover, not every offset on the mask is equally critical to the functionality of the semiconductor structure to be manufactured. A small offset at a critical point should be assessed as more critical than a greater offset at a non-critical point. Therefore, it may be advantageous, by all means, to weight the ascertained offset at a certain point with a measure for the criticality of this point. As a result, the creation of the correction strategy can be optimized further by virtue of taking more account of critical points than less critical points.

The embodiments mentioned above relate to the case where a mask and a wafer exposure generate a chip plane. This is referred to as single exposure method or single patterning.

However, it is not unusual for a chip plane to be produced by use of two or more exposures, i.e., for a so-called double or multi-exposure method or double or multi-patterning to be used. As a rule, two or more masks are also used in the process. Each of these masks contributes to the overall image of the chip plane with their own distortion.

In this case, not only the absolute distortion but also the distortion difference(s) play a role for the subsequent semiconductor structure. Since the distortions or errors are generated individually for each mask in accordance with the method described, the distortion differences can likewise be calculated by simple mathematical subtraction of the individual distortions and a correction strategy, based on the scanner and/or the mask, can subsequently be optimized in this respect. Here, rather than correcting each mask individually to the best possible extent, each mask receives a correction that generates the smallest possible combined overall distortion on the subsequent semiconductor structure.

BRIEF DESCRIPTION OF DRAWINGS

An exemplary embodiment of the invention is explained in greater detail below with reference to the drawing. In the figures.

DETAILED DESCRIPTION

Figure 1:
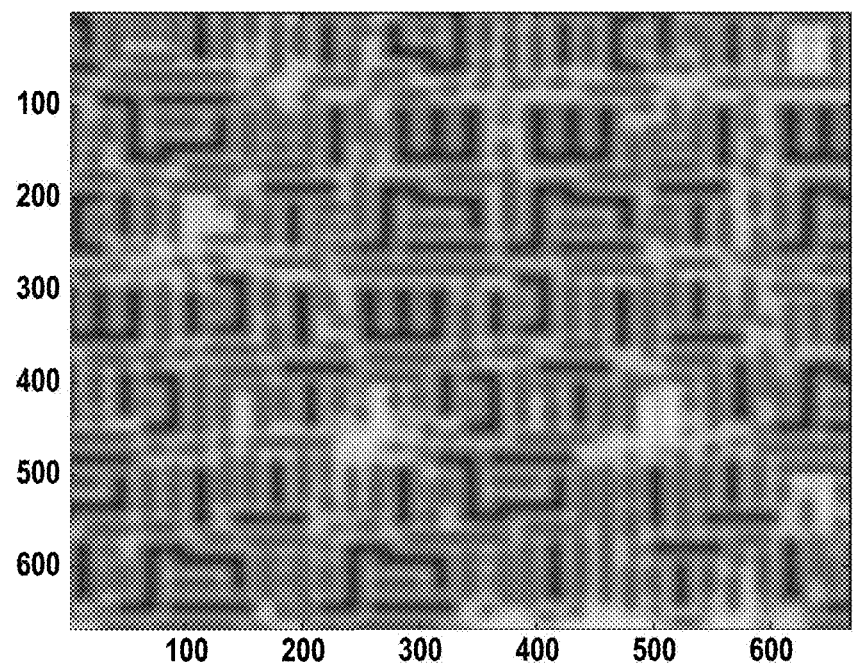
FIG. 1 shows an exemplary aerial image of a mask.

FIG. 1 shows the result of recording a real mask by use of a mask inspection system. An aerial image of a mask as would substantially also arise in a scanner but which was recorded by the mask inspection system under scanner-equivalent conditions is illustrated. Mask inspection systems create scanner-equivalent conditions by virtue of reproducing the scanner to the best possible extent on the illumination side. By way of example, this includes flexible setting of the illumination patterns, so-called settings, and of the polarization patterns using a light source with the same wavelength or a very similar wavelength to that used in the scanner. The intensity distribution, as would also be projected into a photoresist of a wafer to be exposed, is identifiable.

Figure 2:
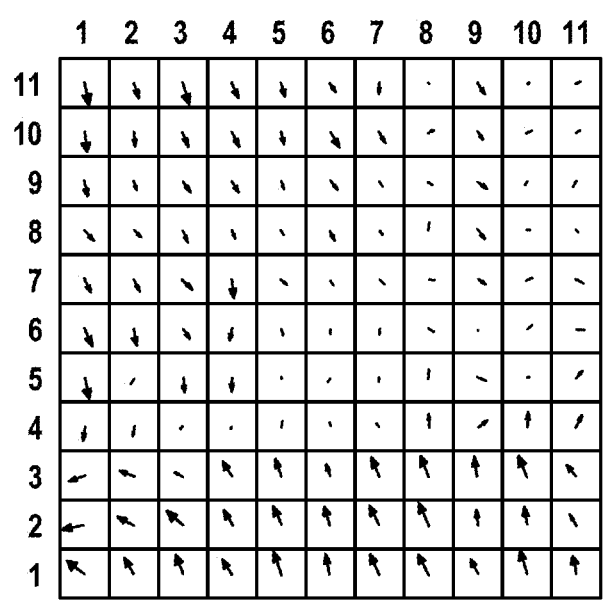
FIG. 2 schematically shows image errors, in particular distortions, in the aerial image illustrated in FIG. 1.

FIG. 2 schematically shows the distortions which can be traced back to the mask inspection system and which are subtracted from the image illustrated in FIG. 1 for image correction purposes. Since these distortions only relate to the mask inspection system, they are irrelevant to the subsequent use of the mask in the scanner and hence to chip manufacturing. A separation of the distortions into distortions caused by the mask itself and distortions due to the mask inspection system is therefore advantageous.

Figure 3:
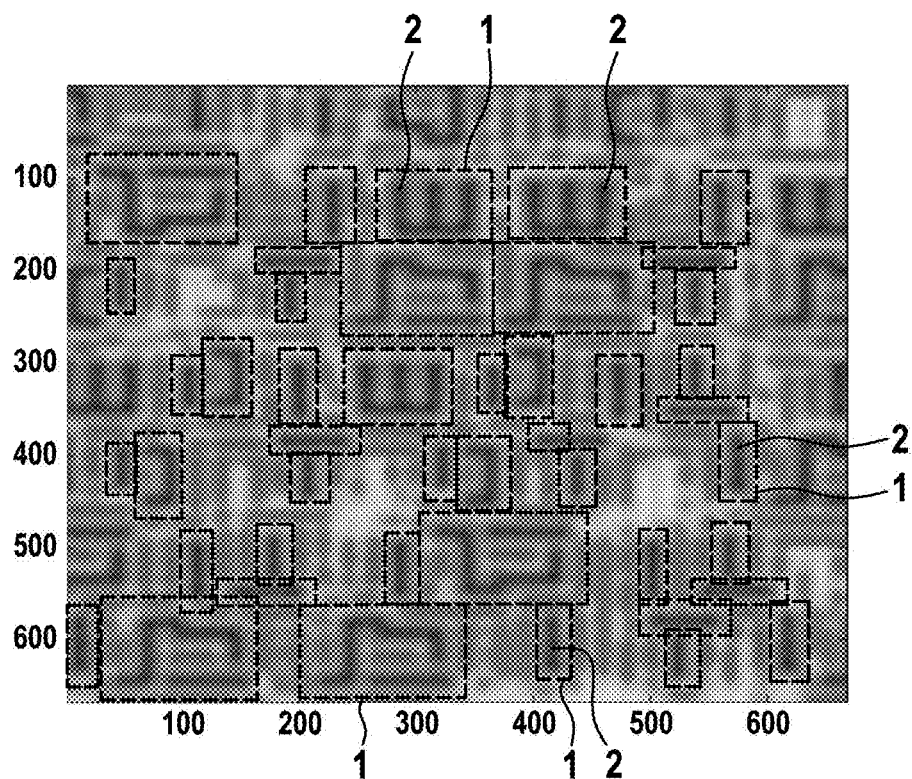
FIG. 3 shows a subdivision of the aerial image into different regions of interest.

FIG. 3 illustrates the subdivision of the distortion-corrected image into different subregions, so-called "regions of interest" 1, which are drawn using dashed lines in this illustration. These regions of interest 1 (denoted "ROI" below) are substantially defined by virtue of containing self-contained features or feature groups of interest, i.e., certain structures 2 or structure groups to be generated on the wafer and accordingly created on the mask.

Figure 4:
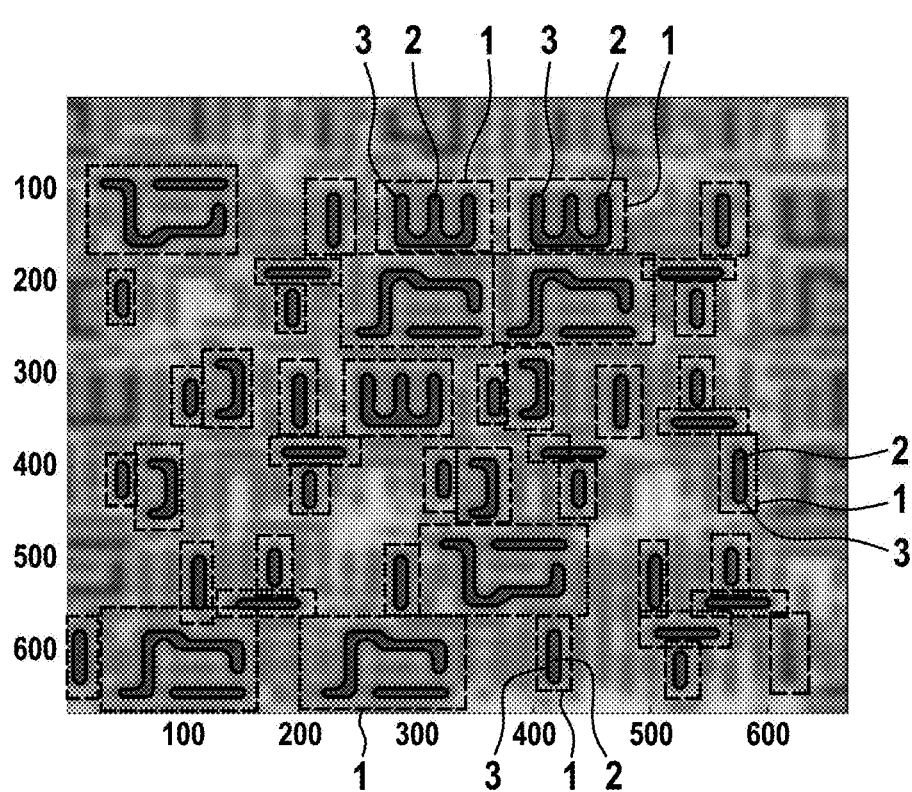
FIG. 4 shows extracted contours of structures.

FIG. 4 shows the result of a first contour extraction for the individual ROIs 1. Here, the contour is extracted by virtue of a certain intensity value, the so-called threshold, initially being defined, said threshold representing a measure for the creation of an edge on the real wafer. It is self-evident that process-specific parameters of the lithography process, such as the type of photoresist employed, also have an influence on the threshold. A large number of edge detection methods are known from image processing (e.g., canny method, Sobel method, gradient-based method, and many more). Another method from this group could also be used instead of a threshold. Further, contours can also be derived by use of artificial intelligence from data records trained using suitable aerial images. Structure edges 3 illustrated with full lines in the individual ROIs are obtained as a result, i.e., the edges 3 that delimit the extracted contours.

Figure 5:
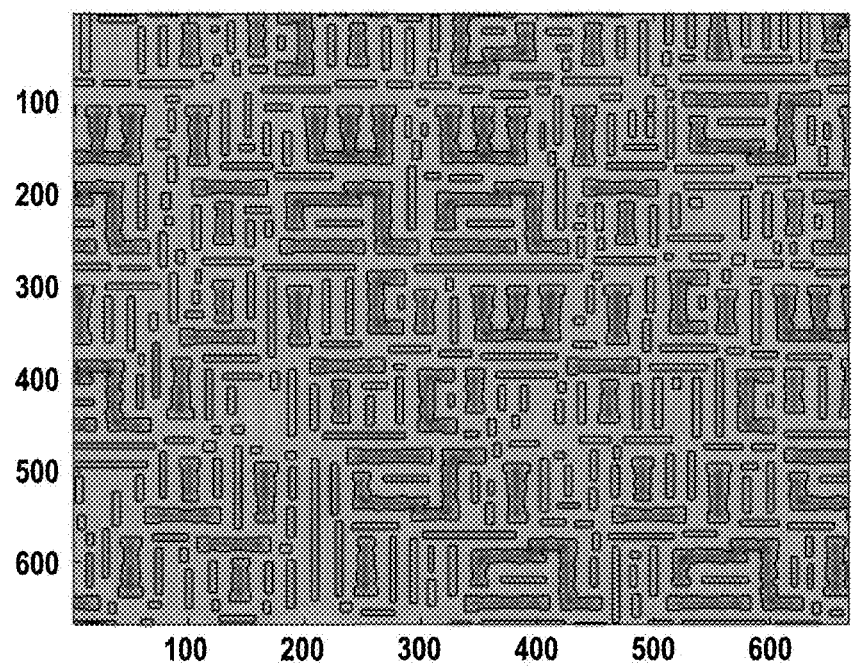
FIG. 5 shows the result of optional matching of the mask design to the aerial image.

FIG. 5 shows the result of optional matching of the mask design to the aerial image.

Figure 6:
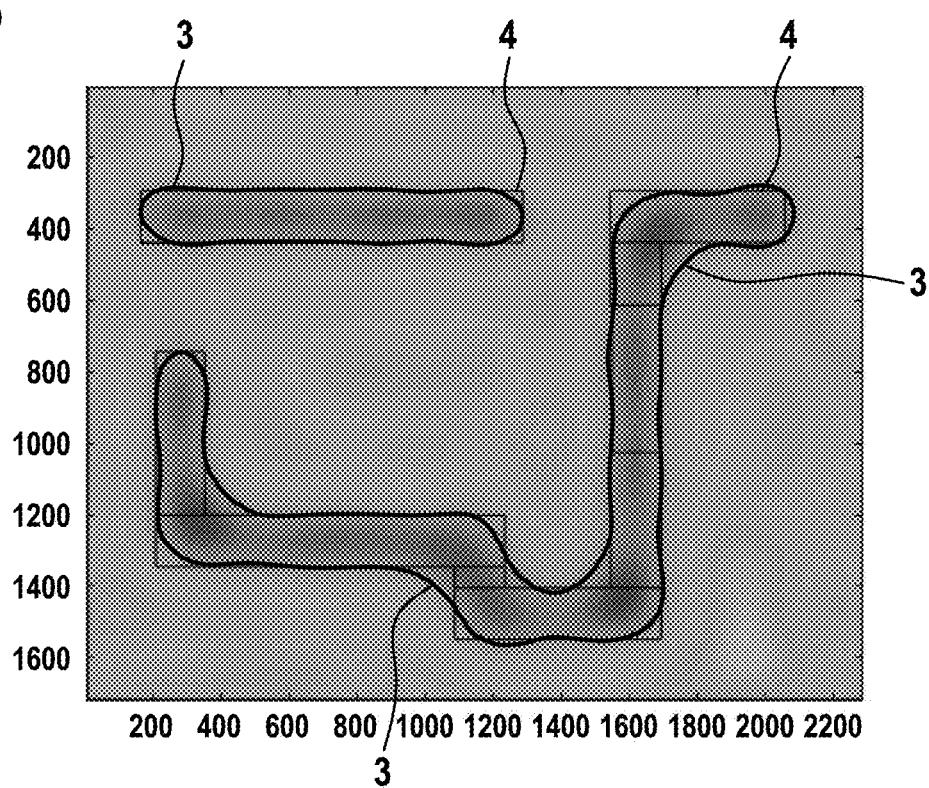
FIG. 6 shows the desired structures on the wafer.

FIG. 6 illustrates the desired structures in the wafer plane, i.e., the litho-target 4, as structures substantially delimited by straight paths. The edges 3 measured in the mask inspection system are now fitted to these structures 4. In particular, the threshold and x- and y-positions come into question as fit parameters. The best possible superposition of the actually measured contours in the wafer plane in relation to the litho-target 4 is obtained from the fitting process. The exact adaptation described was rendered possible by the use of the mask inspection system since the latter, as already mentioned, reproduces the properties of a scanner to a great extent. Thus, the relative position in the wafer plane (x- and y-position) and the threshold with its effect on the edge position are varied in the fitting process until a specified optimization criterion has been satisfied. Since the x- and y-positions are considered to be parameters of the fitting process, a displacement of the structure edges can no longer be deduced with sufficient accuracy from the result. In particular, the process described on the basis of FIG. 6 can be carried out for any ROI. This facilitates for the first time a combination of the real contour generated in the scanner, including all optical imaging effects, and the position thereof on the mask.

Figure 7:
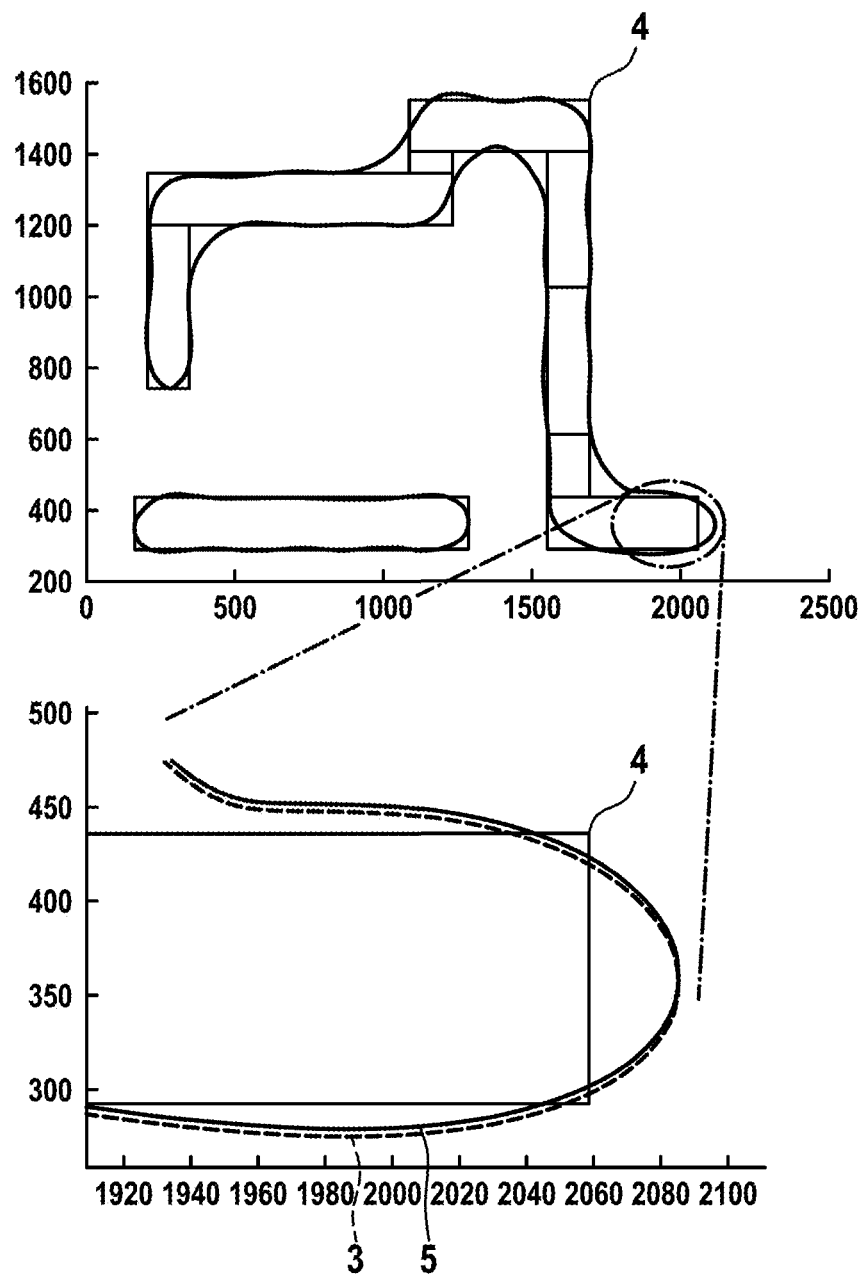
FIG. 7 shows an illustration in which the results of a separate registration measurement are presented together with the result obtained up until this point.

FIG. 7 illustrates a further step, in which the results of a separate registration measurement are applied to the result obtained up to this point. Shown in the figure, in particular in the detail enlargement illustrated at the bottom of the figure, is the litho-target 4, which is identifiable by its straight boundaries, the fitted contour 3 from the aerial image measurement (illustrated using dashes) and the contour 5 that is offset by the separately measured registration error. Here, the registration error can be ascertained by use of a coordinate measuring machine, in particular; naturally, other processes for ascertaining the registration error are also conceivable. The image obtained is distinguished by its great information content. Firstly, it contains a realistic representation of the contours to be expected on the wafer (obtained from the aerial image of the mask inspection system) but, secondly, it also contains the registration error to be expected for each region of interest. Particularly if structures on the same layer of a wafer are intended to be generated by use of a double exposure by two different masks, the case where the different but present registration errors of the masks add up and, in combination with real contours of the features deviating from the litho-target, lead to structures generated with defects as a result may arise. As a result of the foreseeable problem being able to be identified in timely fashion according to the invention on the basis of the mask measurement, it is possible to undertake an effective appropriate mask correction by way of the known systems.

However, the approach described above assumes that the aerial images recorded by a mask inspection system and the aerial images recorded by the registration measurement system do not differ from one another or only differ from one another slightly. However, since the aforementioned systems differ significantly, inter alia in view of the illumination and numerical aperture, this assumption is not quite correct. Therefore, there is the possibility that a registration error ascertained by the registration measurement system is not completely transferable to an aerial image generated by the mask inspection system.

To counteract this problem, a registration image and a mask inspection system image are generated, in addition to the already known method steps, by use of a simulation, in particular by use of a Kirchhoff or rigorous simulation, from the mask design. The simulation of the registration image supplies a value for the registration; in particular, it also takes account of known imaging aberrations such as distortions, for example. This simulation is typically carried out in any case for the purposes of ascertaining the registration. From comparing the two simulated images to one another, it is possible to derive a differential error of the registration measurement between the registration measurement system and the mask inspection system, which can be taken into account during the further measurement and qualification of the mask.

In particular, the x/y-adaptation is initially carried out on the basis of the simulated aerial image (and no longer on the basis of the litho-target).

Then, in the second step and without any further adaptation of the x- and y-values, the threshold is adapted in such a way that the CD values of the respectively considered structure from the litho-target are obtained to the best possible extent.

As a result, a representation of the offset of the ascertained structure with respect to the litho-target, inter alia, is obtained since the simulation of the mask design renders identifiable the errors of the OPC (i.e., of the software on the basis of which the mask design was defined starting from the litho-target).

In some examples, the computational correction of image errors, aberrations and imaging aberrations of the system used to produce the aerial image, the simulation of aerial images on the basis of the mask designs, the ascertaining of structure edges in regions of interest, the adapting of ascertained structure edges to desired structures, the generation of correction strategies for the masks or for the scanner exposure processes, and various computations and/or processing of data (e.g., image data and/or mask design data) and/or implementation of artificial intelligence described above can be implemented by one or more computers according to the principles described above. The one or more computers can be part of the mask inspection system, or be external to and in communication with the mask inspection system. In some examples, a portion of the one or more computers can be part of the mask inspection system. In some examples, the processing of data can be performed by one or more cloud computer servers. The one or more computers can include one or more data processors for processing data, one or more storage devices for storing data, such as one or more databases, and/or one or more computer programs including instructions that when executed by the evaluation unit causes the evaluation unit to carry out the processes. The computer can include one or more input devices, such as a keyboard, a mouse, a touchpad, and/or a voice command input module, and one or more output devices, such as a display, and/or an audio speaker. The computer can show graphical user interfaces on the display to assist the user.

In some implementations, the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processing of data described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

LIST OF REFERENCE SIGNS

1 Region of interest (ROI)
2 Structure
3 Structure edge
4 Litho-target
5 Offset contour from a registration measurement

What is claimed is:

1. A method for measuring a photomask for semiconductor lithography, comprising the following steps:
   recording an aerial image of at least one region of the photomask to generate a recorded aerial image of the at least one region of the photomask,
   defining at least one region of interest of the photomask,
   ascertaining structure edges in the at least one region of interest of the photomask based on the recorded aerial image to generate ascertained structure edges of the photomask,
   providing desired structures to be produced by the photomask,
   adapting the ascertained structure edges in the at least one region of interest of the photomask to the desired structures to be produced by the photomask to generate adapted structure edges of the photomask, in which the ascertained structure edges of the photomask are fitted to the desired structures to be produced by the photomask, and
   displacing the adapted structure edges of the photomask by use of the results of a separate registration measurement.

2. The method of claim 1, wherein, following the recording of the aerial image, there is a computational correction of image aberrations of the system used to record the aerial image.

3. The method of claim 1, wherein an aerial image simulated on the basis of the mask design is used in the step of adapting the ascertained structure edges.

4. The method of claim 3, wherein the simulated aerial image is generated for a registration measurement system and/or for a mask inspection system.

5. The method of claim 1, wherein the ascertained structure edges are used to create correction strategies for the mask or for a scanner exposure process.

6. The method of claim 5, wherein one correction strategy for a mask is targeted physical stretching of the mask.

7. The method of claim 5, wherein matched correction strategies for at least two masks are created.

8. The method of claim 2, wherein an aerial image simulated on the basis of the mask design is used in the step of adapting the ascertained structure edges.

9. The method of claim 2, wherein the ascertained structure edges are used to create correction strategies for the mask or for a scanner exposure process.

10. The method of claim 3, wherein the ascertained structure edges are used to create correction strategies for the mask or for a scanner exposure process.

11. The method of claim 4, wherein the ascertained structure edges are used to create correction strategies for the mask or for a scanner exposure process.

12. The method of claim 6, wherein matched correction strategies for at least two masks are created.

13. The method of claim 1, wherein a best possible superposition of the ascertained structure edges of the photomask in relation to the desired structures to be produced by the photomask is obtained from the fitting process.

14. The method of claim 13, wherein ascertaining structure edges in the at least one region of interest of the photomask comprises extracting a contour of the structure edges in the at least one region of interest from the aerial image of the at least one region of interest based on an intensity threshold value, and wherein the fitting process comprises varying a relative position of the ascertained structure edges of the photomask in relation to the desired structures to be produced by the photomask, and varying an effect of the intensity threshold value on the position of the ascertained structure edges until a specified optimization criterion has been satisfied.

15. The method of claim 14, wherein displacing the adapted structure edges of the photomask by use of the results of a separate registration measurement comprises displacing a realistic representation of the contour of the structure edges in the at least one region of interest of the photomask to be expected on the wafer by use of the results of the separate registration measurement.

16. A method of generating structures on a wafer using a double exposure by a first photomask and a second photomask, the method comprising:

recording an aerial image of at least one region of the first photomask to generate a recorded aerial image of the at least one region of the first photomask;

defining at least one region of interest of the first photomask;

ascertaining structure edges in the at least one region of interest of the first photomask based on the recorded aerial image to generate ascertained structure edges of the first photomask;

providing desired structures to be produced by the first photomask;

adapting the ascertained structure edges in the at least one region of interest of the first photomask to the desired structures to be produced by the first photomask to generate adapted structure edges of the first photomask, wherein the ascertained structure edges of the first photomask are fitted to the desired structures to be produced by the first photomask;

displacing the adapted structure edges of the first photomask by use of the results of a separate registration measurement of the first photomask;

recording a second aerial image of at least one region of a second photomask;

defining at least one region of interest of the second photomask;

ascertaining structure edges in the at least one region of interest of the second photomask to generate ascertained structure edges of the second photomask;

providing desired structures to be produced by the second photomask;

adapting the ascertained structure edges of the second photomask to the desired structures to be produced by the second photomask to generate adapted structure edges of the second photomask, wherein the ascertained structure edges of the second photomask are fitted to the desired structures to be produced by the second photomask; and displacing the adapted structure edges of the second photomask by use of the results of a separate registration measurement of the second photomask.

17. The method of claim 16, wherein the registration measurements are made by a registration measurement system.

18. The method of claim 17, wherein the registration measurements are made by a coordinate measurement system.

19. The method of claim 1, wherein the registration measurement is made by a registration measurement system.

20. The method of claim 19, wherein the registration measurement is made by a coordinate measurement system.

* * * * *